under the united states patent

United States Patent [19]
Kim et al.

[11] Patent Number: 5,430,684
[45] Date of Patent: Jul. 4, 1995

[54] MEMORY SYSTEM FOR PROCESSING DIGITAL VIDEO SIGNAL

[75] Inventors: Young H. Kim, Kyungki-do; Go H. Choi, Seoul, both of Rep. of Korea

[73] Assignee: Goldstar Electron Co., Ltd., Rep. of Korea

[21] Appl. No.: 182,727

[22] Filed: Jan. 14, 1994

[30] Foreign Application Priority Data

Oct. 15, 1993 [KR] Rep. of Korea ............... 21433/1993

[51] Int. Cl.⁶ .............................................. G11C 7/00
[52] U.S. Cl. ........................ 365/230.01; 365/230.06; 365/230.08; 365/189.01; 365/189.12; 365/222
[58] Field of Search ................. 365/189.04, 189.05, 365/189.12, 189.01, 230.01, 230.06, 230.08, 233, 239, 240, 222; 395/400, 425

[56] References Cited

U.S. PATENT DOCUMENTS 5,202,857 4/1993 Yanai et al. .......................... 365/233
5,287,485 2/1994 Umina et al. ..................... 365/230.03

OTHER PUBLICATIONS

Paper Entitled "Choosing Image Compression Chips for Multimedia" Published in the *Electronics Engineer* in Dec. 1992.

*Primary Examiner*—Joseph A. Popek
*Assistant Examiner*—Vu Le
*Attorney, Agent, or Firm*—Poms, Smith, Lande & Rose

[57] ABSTRACT

A memory system for processing digital video signals. The memory system comprise a RBA control means for controlling a RBA using signals applied from the outside, an address generation means for generating an address using an initial address in accordance with the control of the RBA control means, a memory cell array for storing data in accordance with the control of the RBA control means and the address generation means, a transmission control means for controlling the transmission of data from the memory cell array in accordance with the control of the RBA control means and the address generation means and an input and output means for prosecuting the input and output of data in accordance with the control of the RBA control means and the transmission control means.

51 Claims, 6 Drawing Sheets

F I G.8
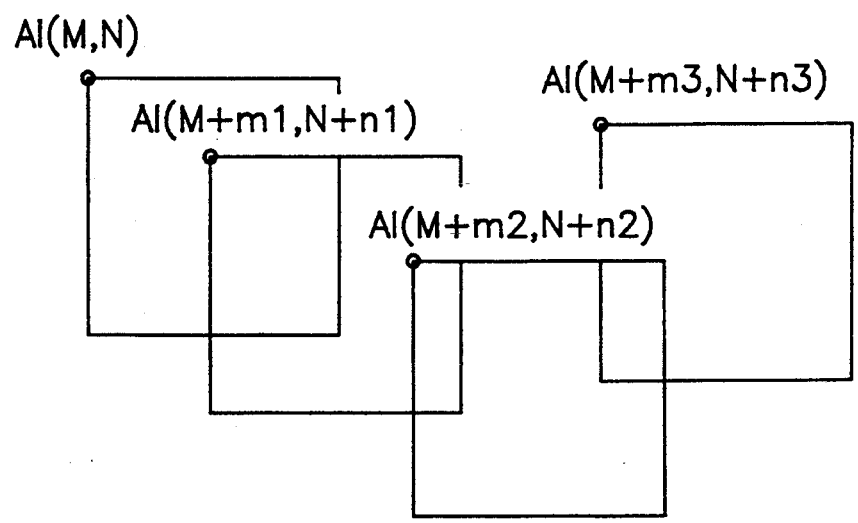
F I G.9
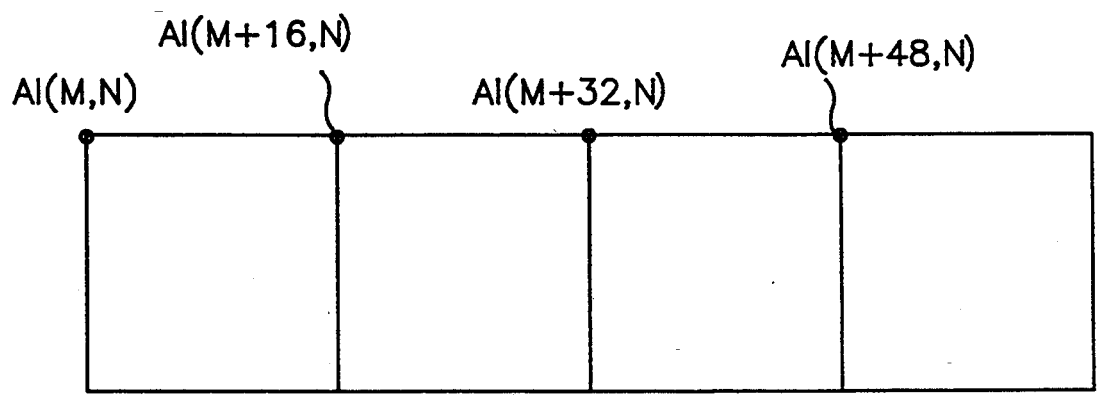

MEMORY SYSTEM FOR PROCESSING DIGITAL VIDEO SIGNAL

BACKGROUND OF THE INVENTION

The present invention relates in general to a memory system for processing digital video signals, and more particularly to a memory system for processing digital video signals having the function of random block read and serial block write which is required to compress and restore video signals.

Generally, random access memory(RAM) such as dynamic random access memory (DRAM) or static random access memory(SRAM) is used as the memory device of memory system for processing digital video signals.

In addition to RAM, a bit stream buffer and a memory controller are also required to convert a format of data in a format of block unit.

Referring to FIG. 1, there is shown a schematic block diagram of a conventional memory system for processing digital video signals.

As shown in FIG. 1, the memory system for processing digital video signals is comprised of a DRAM2 including a controller 1, a frame buffer 4 and a bit stream buffer 3.

A moving picture expert group(MPEG) system, which is a memory system for processing digital video signals, internally processes data in the pixel unit of $16 \times 16$ bits.

For this, the MPEG system converts the format of data into a format of the unit of random bit at the frame buffer 4 which is a DRAM, using the DRAM controller 1 and the bit stream buffer 3.

That is, the memory system for process digital video signals includes the DRAM controller 1 and the bit stream buffer 3 to convert of data the block unit of $16 \times 16$ bits into data of the unit of bit upon writing data to the frame buffer 4 and to convert data which is read in the unit of bit into data of the unit of $16 \times 16$ bits upon reading data which are necessary therein from the DRAM(4).

As above mentioned, since the conventional memory system for processing digital video signals processes digital data necessary to the signal process using SRAM or DRAM, a memory controller from the outside is used for the random block access which is essential in the present methods of international standard for processing video signals such as JPEG, MPEG and digital HDTV.

However, since the memory controller being used in the memory system for processing digital video signals should use the format of pipe line or memory multiplexing to improve the speed of read and write and its construction ais also complicated, there is a considerable problem in view of arrangement or control, upon developing its application system.

SUMMARY OF THE INVENTION

Therefore, the present invention has been made in view of the above problem, and it is an object of present invention to provide a memory system for processing digital video signals which has the function of random block read and serial block write being required to compress and restore video signals, thereby enabling video signals of international standard to be processed.

In accordance with the present invention, the above and other objects can be accomplished by providing a memory system for processing digital video signals comprising Random Block Access (RBA) control means for controlling the random block access using signals applied from the outside;

address generation mean for generating an address using an initial address in accordance with the control of the RBA control means;

memory cell array for storing data in accordance with the control of the RBA control means and the address generation means;

transmission control means for controlling the data transmission of the memory cell array in accordance with the RBA control means and the address generation means; and input and output means for inputting and outputting data in accordance with the control of the RBA control means and transmission control means.

BRIEF DESCRIPTION OF THE DRAWINGS

FIG. 8 is a diagram showing the memory map upon performing the operation for RBA read; and FIG. 9 is a diagram showing the memory map, upon performing the operation of RBA write.

DETAILED DESCRIPTION OF THE PREFERRED EMBODIMENTS

The present invention will now be explained in conjunction with the attached drawings.

Figure 1:
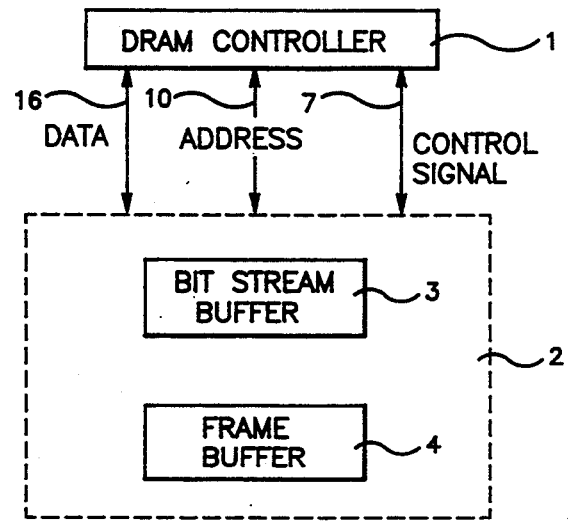
FIG. 1 is a block diagram showing a conventional memory system for processing digital video signals.
Figure 2:
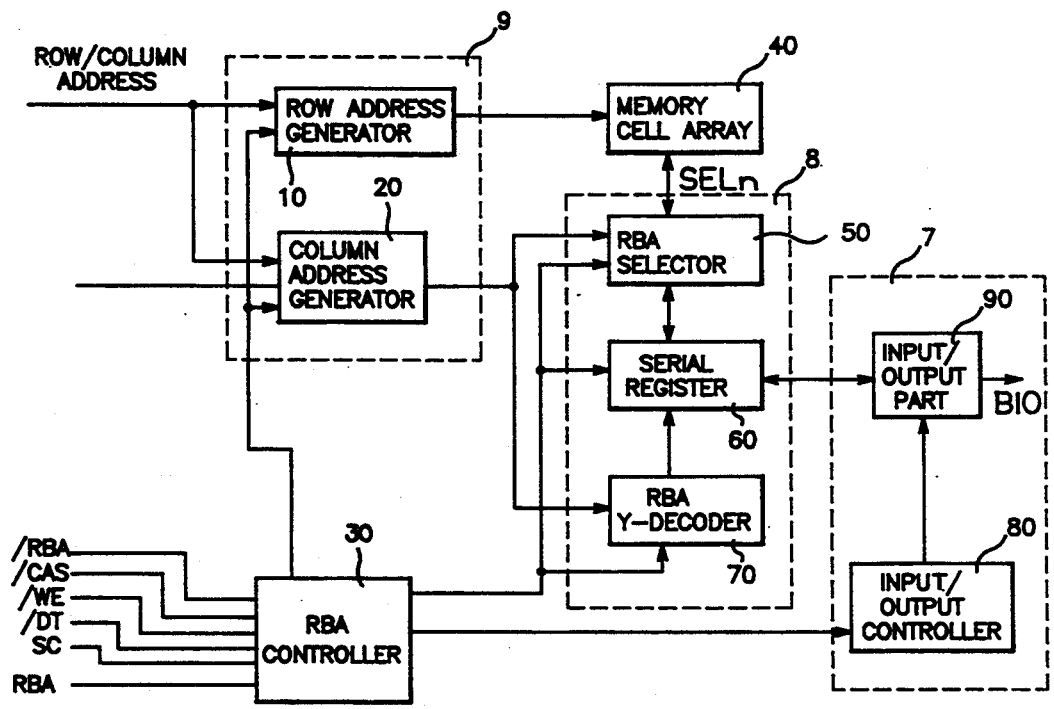
FIG. 2 is a block diagram showing a memory system for processing digital video signals according to the present invention.

Referring to FIG. 2, there is a block diagram showing a memory system for processing digital video signals, in accordance with an embodiment of the present invention.

As shown in FIG. 2 a memory system for processing digital video signals according to the present invention comprises a RBA controller 30 for controlling a RBA signal using a signal applied from the outside, an address generating part 9 for generating an address using a start address in accordance with the control of the RBA controller 30, a memory cell array 40 for storing data in accordance with the control of the RBA controller 30 and the address generating part 9, a transmission control unit 8 for controlling the transmission of data from the memory cell array 40 in accordance with the control of the RBA controller 30 and the address generating part 9 and an input and output unit 7 for performing the input and output of data in accordance with the control of the RBA controller 30 and the transmission control unit 8.

The address generating part comprises a row address generator 10 and a column address generator 20. The transmission control unit 8 comprises a RAB selector 50, a serial register 60 and a RBA Y-decoder 70. The input and output unit 7 comprises an input and output part 90 and an input and output controller 80.

As shown in FIG. 2 a memory system for processing digital video signals in accordance with another embodiment of the present invention comprises a row address generator 10, a column address generator 20, a RBA controller 30, a memory cell array 40, a RBA selector 50, a serial registry 60, a RBA Y-decoder 70, an input and output controller 80 and an input and output part 90.

The row address generator 10 generates an internal row address using an initial row address and signals outputted from the RBA controller 30 to select a word line of the memory cell array 40.

The column address generator 20 generates an internal column address using a started-initial column address and signals outputted from the RBA controller 30, thereby to output the column address to the Random Block Access(RBA) selector 50 and the RBA Y-decoder 70.

The RBA controller 30 makes and outputs signals for controlling the row address generator 10, the column address generator 20, the RBA selector 50, the serial register 60, the RBA Y-decoder 70 and the input and output controller 80 using a row address strobe signal/-RAS, a column address strobe signal/CAS, a write enable signal/WE, a data transmission signal/DT, a serial clock SC and a RBA control signal RBA.

The memory cell array 40 is comprised of a DRAM cell array and is controlled by the row address generator 10 and the RBA selector 50, via word lines and bit lines.

The RBA selector 50 outputs a select signal SELn for controlling the transmission of data between the memory cell array 40 and the serial register 60 in accordance with signals outputted from the column address generator 20 and the RBA controller 30.

The serial register 60 transmits data to the memory cell array 40 and the input and output part 90 or receives data from them, in accordance with signals outputted from the RBA selector 50, the RBA Y-decoder 70 and the RBA controller 30.

The RBA Y-decoder 70 makes and outputs a Y-address for controlling the serial register 60 using a column address inputted from the column address generator 20, in accordance with a signal outputted from the RBA controller 30.

The input and output controller 80 controls the input and output part 90 in accordance with signals outputted from the RBA controller 30.

Figure 3:
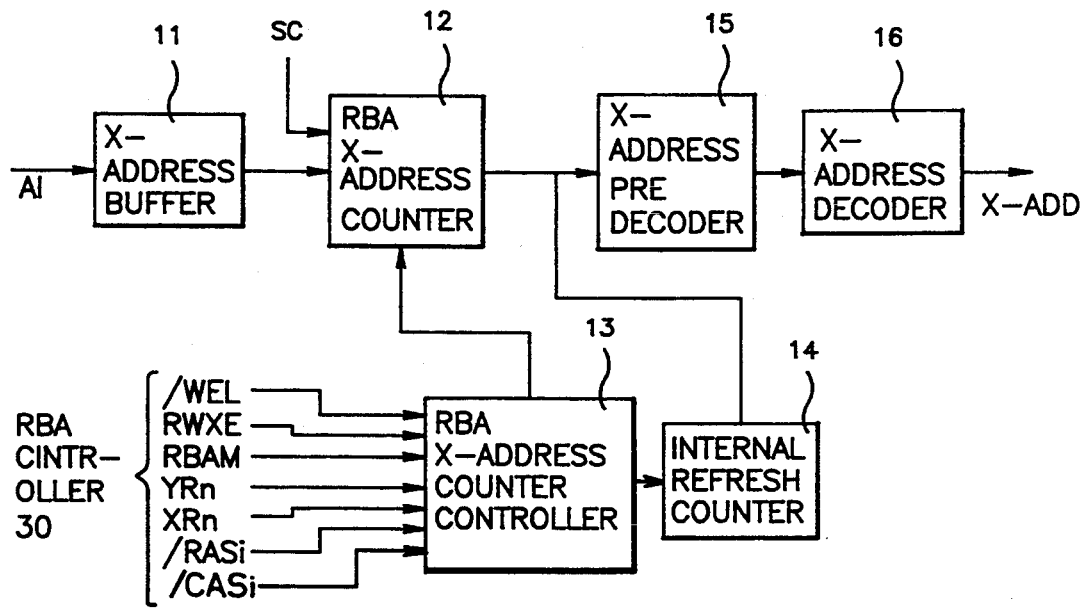
FIG. 3 is a detailed block diagram showing a row address generator of FIG. 2.

The input and output part 90 transmits data to the serial register 60 and the outside or receives data from them in accordance with the control of the input and output controller 80. FIG. 3 a detailed diagram of the row address generator 10 shown in FIG. 2.

As shown in FIG. 3, the row address generator 10 comprises a X-address buffer 11, a X-address counter 12, a RBA X-address counter controller 13, an internal refresh counter 14, a X-address pre-decoder 15 and a X-address decoder 16, and outputs a row address X-ADD for selecting a word line of the memory cell array 40.

The X-address buffer 11 latches an initial X-address of address inputs AI. The RBA X-address counter controller 13 controls the RBA X-address counter 12 and designates the start point for counting RBA X-address in response to a write enable latch signal/WEL, a RBA write X enable signal RWXE, a RBA mode flag signal RBAM, a X-state pointer signal X Rn, a Y-state pointer signal YRn and an internal RAS signal/RAS which are outputted from the RBA controller 30 as input signals.

The RBA X-address counter 12 utilizes serial clock and increases the X-address outputted from the X-address buffer 11 by "1" every the serial clock cycle of the unit of data block, in accordance with the control of the RBA X-address counter controller 13.

The internal refresh counter 14 counts the X-address which is increased by "1" every serial clock (SC) cycle of the unit of data block from any initial value, and generates an address which can refresh a DRAM cell in the memory cell array 40.

The X-address pre-decoder 15 selects a word line for accessing RBA read data during the first half of serial clock cycle of the unit of data block, utilizing a row-address outputted from the RBA X-address counter 12 and a refresh address outputted from the internal refresh counter 14, and pre-decodes an address such that the function of refreshing during the second half of serial clock cycle utilizing the refresh address.

The X-address decoder 16 decodes the address pre-decoded by the X-address pre-decoder 15, to output a row address X-ADD suitable for the selection of a word line from the memory cell array 40.

It is also possible to embody the decoding procedure merely with the X-address decoder 16 without using the X-address pre-decoder 15.

However, the X-address pre-decoder 15 may be added to the X-address decoder 16 to construct a decoding circuit easily, as above mentioned.

Figure 4:
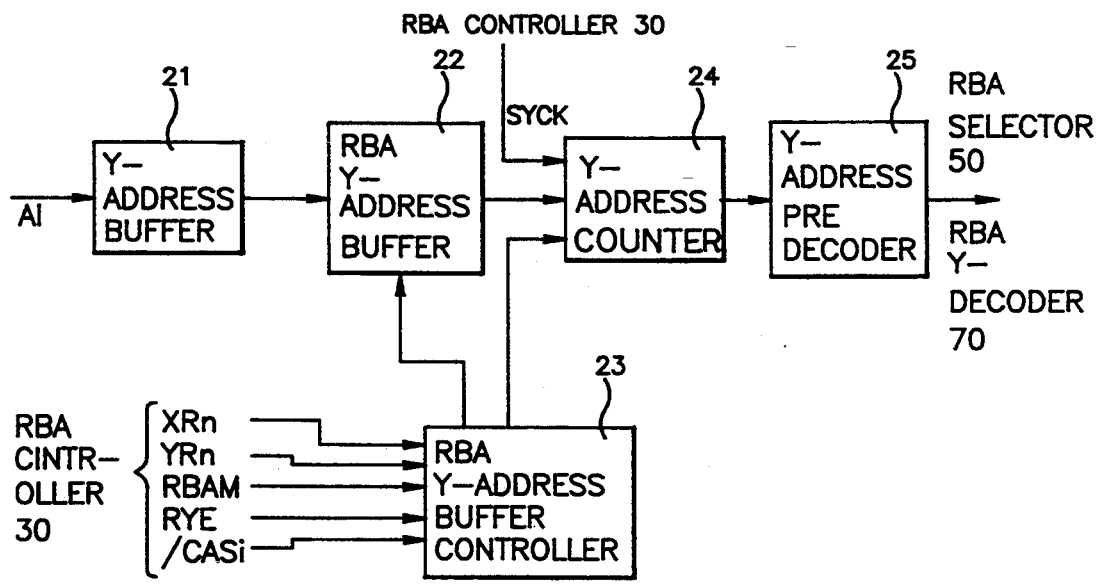
FIG. 4 is a detailed block diagram showing a column address generator of FIG. 2.

FIG. 4 is a detailed diagram showing the column address generator 20 of FIG. 2.

As shown in FIG. 4, the column address generator 20 comprises a Y-address buffer controller 21, a RBA Y-address buffer 22, a RBA Y-address buffer controller 23, Y-address counter 24 and a Y-address pre-decoder 25, and it controls the RBA selector 50 between the bit line of memory cell array 40 and the serial register 60 and the operation of RBA Y-decoder 70.

The Y-address buffer 21 latches an initial Y-address of address input signals AI.

The RBA Y-address buffer 22 delays the Y-address outputted from the Y-address buffer 21 for the serial clock cycle of the unit of data block and then outputs the delayed Y-address to the Y-address counter 24.

Of course, it is also possible to perform the procedure for latching and delaying the Y-address through the Y-address buffer 21 and the RBA Y-address buffer 22, respectively, merely with the RBA Y-address buffer 22 without using the Y-address buffer 21.

As above mentioned, however, the Y-address buffer 21 may be added to the RBA Y-address buffer 22, to make the construction and operation of buffer circuit easily.

The RBA Y-address buffer controller 23 controls the operation of Y-address counter 24 and RBA Y-address buffer 22 in response to a RBA mode flag signal RBAM, a RBA Y-enable signal RYE, an internal column address strobe (CAS) signal/CASi, a X-state pointer signal XRn and a Y-state pointer signal YRn which are outputted from the RBA controller 30 as input signals.

The Y-address counter 24 increases the Y-address outputted from the RBA Y-address buffer 22 by "1" every 1 serial clock cycle with the serial clock cycle period of the unit of data block in accordance with the control of RBA Y-address buffer controller 23, utilizing system clock signals outputted from the RBA controller 30.

The Y-address pre-decoder 25 pre-decodes the Y-address outputted the Y-address counter 24 and then outputs the pre-decoded Y-address to the RBA selector 50 and the RBA Y-decoder 70.

Figure 5:
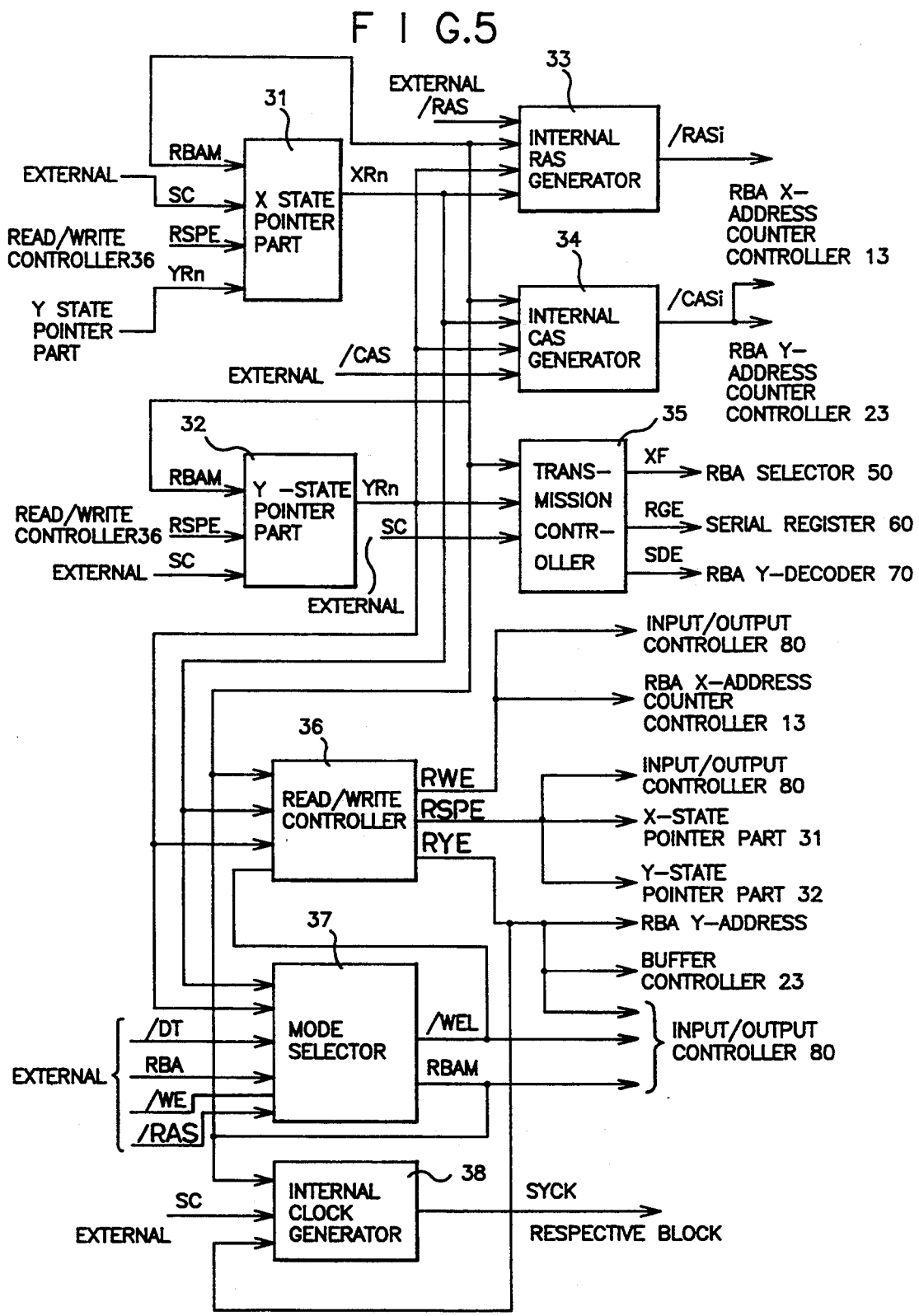
FIG. 5 is a detailed block diagram showing a RBA controller of FIG. 2.

FIG. 5 is a detailed construction diagram of the RBA controller 30 shown in FIG. 2.

As shown in FIG. 5, the RBA controller 30 comprises a X-state pointer part 31, a Y-state pointer part 32, an internal row address strobe(RAS) generator 33, an internal column address strobe (CAS) generator 34, a transmission controller 35, a read and write controller 36, a mode selector 37 and an internal clock generator 38.

Herein, the X-state pointer part 31 is comprised of a counter of nbits and becomes a ripple counter of 4 bits in case of the block size of 16×16 bits.

The X-state pointer part 31 outputs a X-state pointer signal XRn in response to a serial clock, a RBA mode flag signal RBAM outputted from the mode selector 37, a RBA state pointer enable signal RSPE outputted from the read and write control part 36 and a Y-state pointer signal YRn outputted from the Y-state pointer part 32 which are input signals.

That is, if RBA mode is set-up, the X-state pointer part 31 starts to count from "0" and increases the X-state pointer signal XRn by "1" every when the Y-state pointer part 32 is again reset from the unit of data block to "0".

The Y-state pointer part 32 is a counter of n−bits and becomes a ripple counter of 4 bits, in case of the block size of 16×16 bits.

The Y-state pointer part 32 thus outputs a Y-state pointer signal YRn in response to a RBA mode flag signal RBAM outputted from the mode selector 37, a RBA state pointer enable signal YRn from the read and write controller 36 and serial clock SC which are input signals. That is, if the RBA mode is set-up, the Y-state pointer part 32 starts to count from "0" and increases to count by "1" every cycle of serial clock.

During counting, if the cycle of serial clock having the unit of data block is lapsed, the Y-state pointer part 32 is reset and then starts to count again.

The internal RAS generator 33 outputs an internal RAS signal/RASi to the RBA X-address counter controller 13, utilizing a row address strobe signal/RAS inputted from the outside, theX-state pointer signal XRn outputted from the X-state pointer part 31, the Y-state pointer signal YRn outputted from the Y-state pointer part 32 and the RBA mode flag signal RBAM outputted from the mode selector 37.

That is, the internal RAS generator 33 first makes an internal RAS signal/RASi for accessing data of the memory cell array 40 for the first half of the serial clock cycle having the unit of data block and then makes an internal RAS signal/RASi for refreshing for the second half of the serial clock cycle having the unit of data block, under the control of the X-state pointer part 31 and then Y-state pointer part 32.

The internal CAS generator 34 outputs a CAS signal/CASi to the RBA Y-address counter controller 23, utilizing column address strobe signal/cas inputted from the outside, X-state pointer signal XRn outputted from the X-state pointer part 31, Y-state pointer signal outputted from the Y-state pointer part 32 and RBA mode flag signal outputted from the mode selector 37.

That is, the internal CAS generator 34 first makes an internal CAS signal/CASi for accessing data of the memory cell array 40 for the first half of the serial clock cycle having the unit of data block and then makes an internal CAS signal for refreshing for the second half of the serial clock cycle having the unit of data block, under the control of the X-state pointer part 31 and the Y-state pointer part 32.

The transmission controller 35 outputs a transmission signal XF for controlling a time which is required to transfer data from the memory cell array 40 to the serial register 50, to the RBA selector 50, outputs a register enable signal RGE for controlling to apply a power source Vcc into the serial register 60, to the serial register 60, and outputs a serial decoder enable signal SED for enabling the RBA Y-decoder 70, to the RBA Y-decoder 70, utilizing the Y-state pointer signal YRn outputted from the Y-state pointer part 32, the RBA mode flag signal RBAM outputted from the mode selector 37 and the serial clock inputted from the outside.

The read and write controller 36 outputs a RBA write X enable signal RWXE to the input and out controller 80 and the RBA X-address counter controller 13 so that respective blocks can be operated at a proper time upon performing the read mode and the write mode, outputs a RBA state pointer enable signal RSPE to the X-state pointer part 321, the Y-state pointer part 32 and the input and output controller 80, and also outputs a RBA Y-enable signal RYE to the input and output controller 80, the RBA Y-address buffer controller 23 and the internal clock generator 38, in response to the RBA mode flag signal RBAM outputted from the mode selector 37, the write enable latch signal/WEL, the X-state pointer signal XRn outputted from the X-state pointer part 31 and the Y-state pointer signal YRn outputted from the Y-state pointer part 32 which are input signals.

The mode selector 37 outputs a RBA mode flag signal RBAM setting up the RBA mode to respective blocks including the input and output controller 80 and also outputs a write enable latch signal/WEL representing whether it is the read mode or the write mode to the input and output controller 80, the read and write controller 36 and the RBA X-address counter controller 13, in response to the X-state pointer signal XRn outputted from the X-state pointer part 31, the Y-state pointer signal YRn outputted from the Y-state pointer part 32, a data transmission signal/DT inputted from the outside, the RBA control signal RBA and write enable signal/WE which are input signals.

The internal clock generator 38 generates system clocks from a time at which Y-address signal should be enabled such that the system clocks are used as the clocks of signals related to Y-address.

Hereinafter, the operation of memory system for processing digital video signals will be briefly described.

When the row address strobe signal/RAS is fallen, the memory system sets a proper mode in accordance with the state of the write enable signal/WE, the data transmission signal/DT and the RBA control signal RBA and makes an internal row address X-ADD for selecting a word line of the memory cell array, utilizing a row address of the address input signals AI.

When the column address strobe signal/CAS is also fallen, the memory system first makes an internal column address Y-ADD for selecting a proper cell of memory cells connected to a selected word line of the memory cell array 40, utilizing a column address of the address input signal AI and then makes an internal Y-address for connecting the data line of input and output part 90 with that of the serial register 60 and a selection signal SELN for transmitting data between the selected cells of the memory cell array 4 and the serial register 60. The input data and output data (16×16 bits) of any block is then continuously inputted and outputted through the input and output part 90, in accordance with the control of the input and output control part 80.

The memory system performs continuously repeating the above operation, thereby enabling data of the block unit to be read and written continuously.

Figure 6:
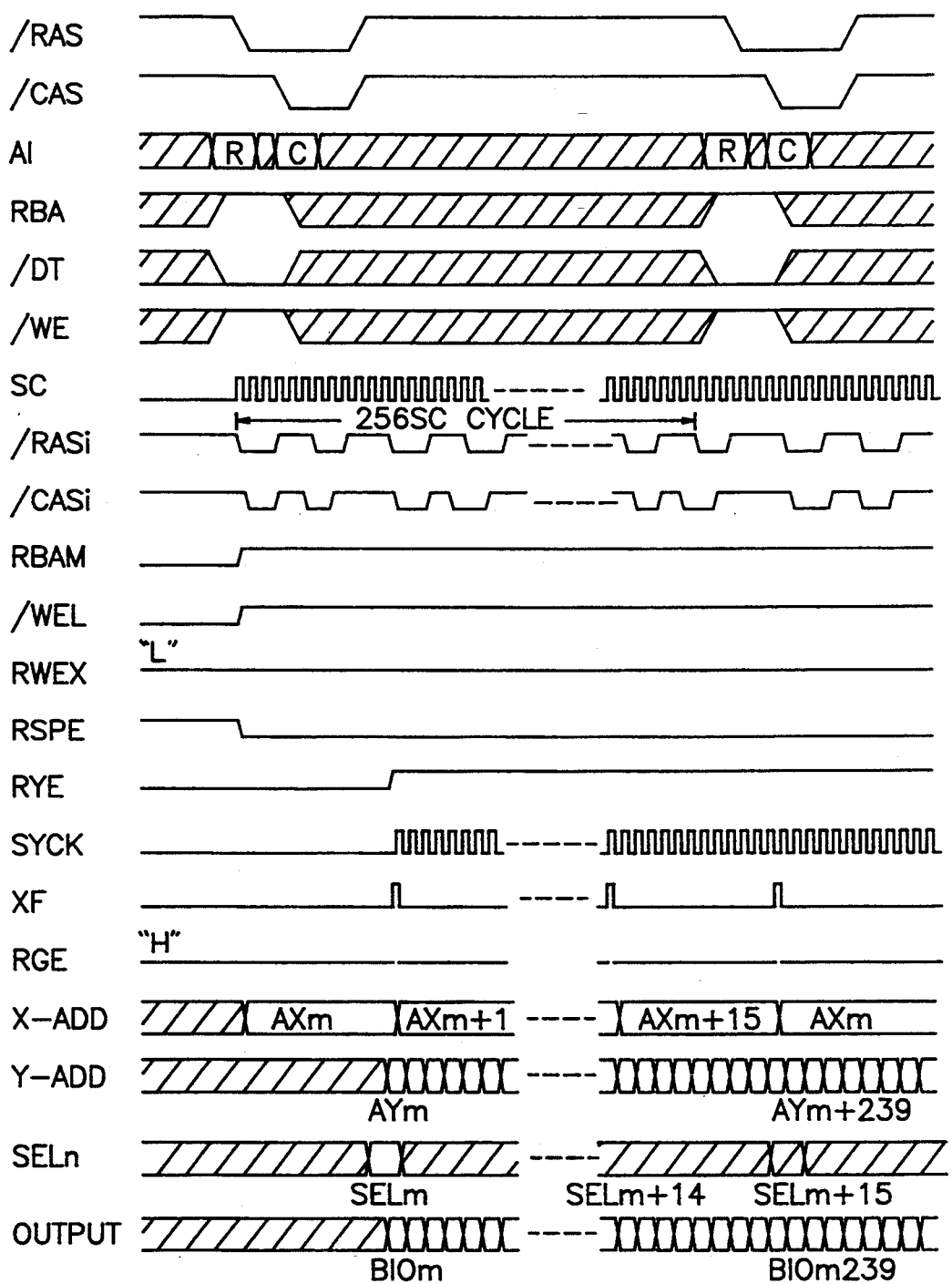
FIG. 6 is a diagram showing signal waveforms at respective locations of FIGS. 3, 4 and 5, upon performing the operation of read.

FIG. 6 is to show signal waveforms at respective parts of FIGS. 3, 4 and 5, upon the operation of read.

Figure 7:
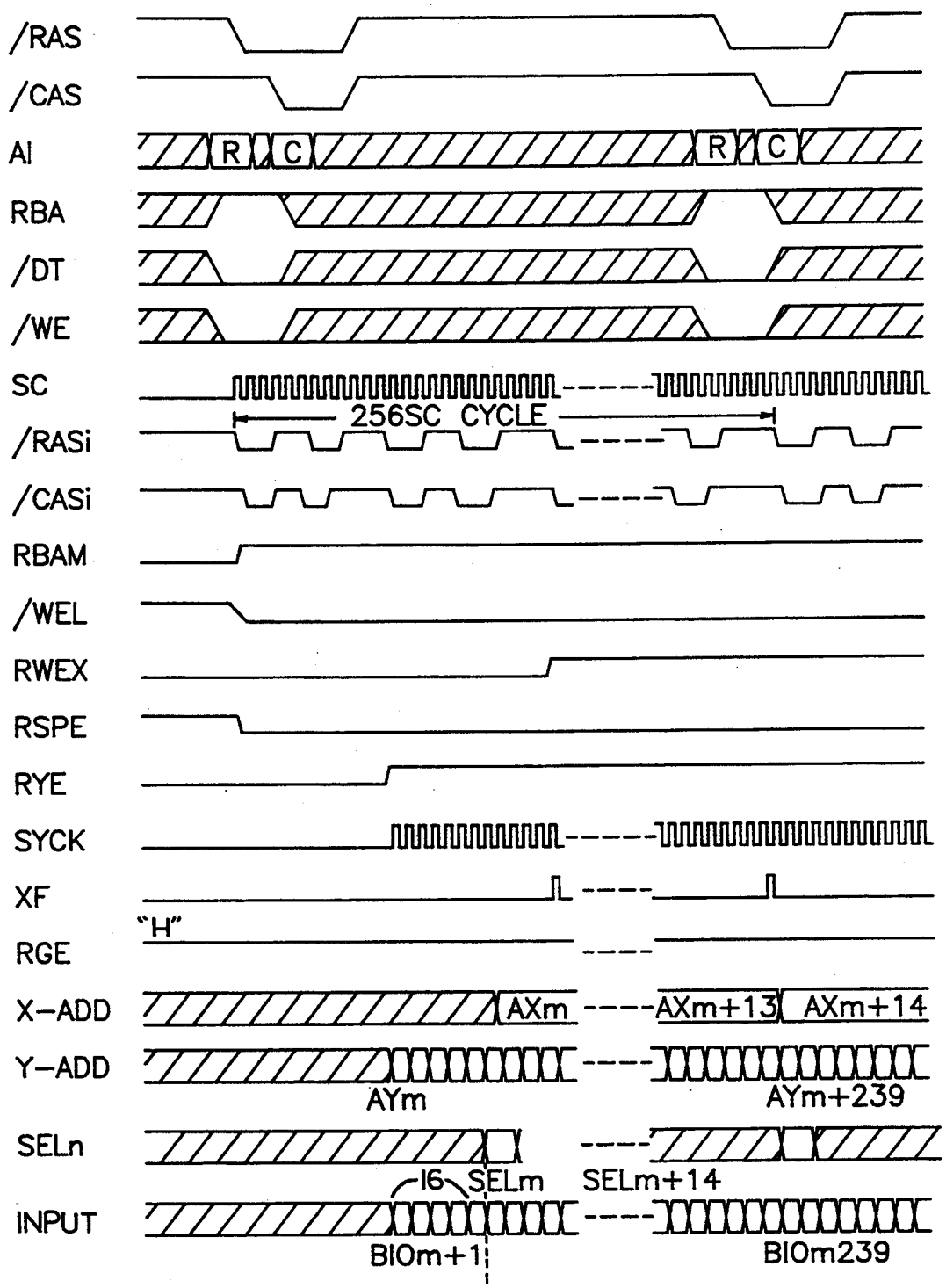
FIG. 7 is a diagram showing signal waveforms at respective locations of FIGS. 3, 4 and 5, upon performing the operation of write.

FIG. 7 is to show signal waveforms at respective parts of FIGS. 3, 4 and 5 upon the operation of write.

In case that the unit of data block is 16×16 bits, for example, the operation of RBA will be hereinafter described with reference to FIGS. 6 and 7.

First, the operation of read will be described with reference to FIG. 6.

The read operation of RBA means a function in which any address is received the data of the memory cell array 40 inputted with the block size of m×n bits, that is 16×16 bits, as the start address and the operation of read is performed in response to the start address.

If the RBA control signal RBA of "HIGH" state, the data transmission signal/DT of "LOW" state and the write enable signal/WE of "HIGH" state are applied to the mode selector 37, at the falling edge in which the row address strobe signal/RAS applied to the internal RAS generator 33 becomes from "HIGH" to "LOW" state, the mode selector 37 makes the RBA mode flag signal RBAM and the write enable latch signal/WEL of "HIGH" state so that the system mode becomes the mode of RBA read.

Due to this, the whole memory system starts the operation of RBA read mode.

The row address generator 10 generates an internal row address for RBA utilizing the row address of address input signals AI applied from the outside by the control of the X-state pointer part 31 and the serial clock SC, under a state in which the row address strobe signal/RAS is the falling edge.

The generated internal row address, that is, X-address is generated every when the row address applied from the outside per 16 cycle of serial clock is increased by "1" and it is can continuously select 16 word lines when the 256th cycle of serial clocks is lapsed.

The internal X-address X-ADD capable of selecting the following 16 word lines is again generated utilizing the address input signals AI inputted from the outside at 257th cycle, in identical to the operation of former 256 cycles of serial clock. This operation is repeated continuously.

The internal refresh counter 14 counts the row address being increased by "1" every 16 cycle of serial clock from any initial value and generates a row address capable of refreshing a DRAM cell in the memory cell array 40.

The X-address pre-decoder 15 pre-decodes address so that a word line for accessing the data of RBA read is selected for 8 cycles of the first half, of 16 cycles of serial clock, utilizing the internal row address for RBA and then also pre-decodes address utilizing the refresh row address so that the refresh operation is performed for 8 cycles of the second half, of 16 cycles of serial clock.

The X-address decoder 16 decodes address using the pre-decoded address, so that a proper word line is selected.

The column address generator 20 generates an internal column address for RBA every cycle of serial clock by control signals outputted from the Y-state pointer part 32 and the internal clock generator 38, utilizing Y-address, that is, column address of address input signals AI applied from thje outside at a state in which the column address strobe signal/CAS is the falling edge.

After the internal X-address selects a word line of the memory cell array 40 and a bit line sense amplifier in the memory cell array then senses data in a memory cell enough, that is, after 16 cycles of serial clock, the internal Y-address is outputted.

Data from the selected memory cell is transferred to the serial register 60 utilizing selection signal SELn outputted from the RBA selector 50. At this time, the internal Y-address controls to transfer data of a desired block from the serial register 60 to a data line.

That is, the initial Y-address value of the address input signals AI is latched in the internal Y-address buffer 21 and then delayed for 16 cycles of serial clock in the RBA Y-address buffer 22.

Thereafter, the delayed initial Y-address is loaded to the Y-address counter 24 and then counted as the successive Y-address increased by "1" every cycle of serial clock with a period of cycles of serial clock. After 16 cycles of serial clock are lapsed, a same value as the above-initial Y-address value is again loaded at 172 and Y-address same as the above-internal Y-address counted for from the first cycle of serial clock to the 16the serial clock cycle is again counted.

This operation is repeated sixteen times, that is, for 256 cycles of serial clock and the initial Y-address value of address input signals AI inputted from the outside is then re-loaded by the Y-address counter 24 at a state in which the column address strobe signal signal/CAS is the falling edge. After the re-loading of the initial Y-address value, the Y-address counter 24 counts the initial Y-address.

At this time, the Y-address pre-decoder 25 pre-decodes the Y-address outputted from the Y-address counter 24 and then outputs the pre-decoded Y-address to the RBA selector 50 and the RBA Y-decoder 70.

The RBA selector 50 controls to transfer data from a selected memory cell to the serial register 60, using the pre-decoded Y-address.

The RBA Y-decoder 70 outputs a Y-address using the pre-decoded Y-address, so that data read from the serial register 60 to the input and output part 90 are transferred.

The RBA controller 30 generates internal control signals, so that the system is operated in the RBA read mode when the colum address strobe signal/CAS, the RBA control signal RBA and the write enable signal/WE become "HIGH" state and the data transfer signal/DT becomes "LOW" state, at the falling edge in which the strobe signal/RAS is fallen from "HIGH" to "LOW".

The internal RAS generator 33 makes an internal RAS signal/RASi. That is, it makes an internal RAS signal/RASi for accessing data of the memory cell array in the first half of 16 cycles of serial clock and then makes an internal RAS signal/RASi for refreshing in the second-half, under the control of the X-state pointer part 31 and the Y-state pointer part 32.

The internal CAS generator 34 makes an internal CAS signal/CASi responsive to column address strobe signal/CAS from the outside.

In more detail, it makes an internal CAs signal/CASi for accessing data of the memory cell array 40 during the first half of 16 cycles of serial clock and then makes an internal CAS signal/CASi for refreshing during the second half, under the control of the X-state pointer part 31 and Y-state pointer part 32.

The internal RAS signal RASi and the internal CAS signal/CASi which are made by the internal RAS generator 33 and the internal CAS generator 34 are used as the row address strobe signal and the column address strobe signal for actually operating the inside of memory system.

The internal RAS signal/RASi and the internal CAS signal/CASi are controlled, so that the inside of memory system can perform a same operation every 16 cycles of serial clock.

The transmission controller 35 generates a transmission signal XF for controlling a time point at which data are transmitted from the memory cell array 40 to the serial register 60, a register enable signal RGE and a serial decoder enable signal SDE.

The transmission signal XF is generated as a pulse by one time every 16 cycles of serial clock from after the row address strobe signal/RAS is fallen and 16 cycles of serial clock are then lapsed, such that data from respective selected memory cell are transmitted to the serial register 60 every when the pulse is generated.

The register enable signal RGE controls to apply a power source Vcc into the serial register 60, to make the transmission of data easy.

The serial decoder enable signal SDE enables the serial decoder constructing the RBA Y-decoder 70, thereby causing the transmission of data between the serial register 60 and the input and output part 90 to be controlled.

The read and write controller 36 generates an enable signal capable of operating respective blocks at a proper time point upon performing the read mode and the write mode.

The RBA write enable signal RWXE maintains "LOW" state from the start upon performing the read mode. Therefore the internal X-address X-ADD is applied from the start of the read mode, thereby enabling the memory cell array 40 to be accessed.

The RBA pointer enable signal RSPE outputted from the read and write controller 36 becomes "LOW" state to enable the whole system if the initial state in the system is set-up.

Upon performing the read mode, the RBA Y-enable signal RYE outputted from the read and write controller 36 becomes. "HIGH" state after the unit of data block, that is, the 16 cycles of serial clock, such that the Y-address Y-ADD can be generated after a word line in the memory cell array is selected enough by the internal X address X-ADD.

The mode selector 37 sets-up the RBA mode and then represents whether the present mode is the read mode or the write mode utilizing the write enable latch signal/WEL.

In case of the RBA read mode, the RBA mode flag signal RBAM outputted from the mode selector 37 and the write enable latch signal/WEL becomes "HIGH" state at the falling edge of the row address strobe signal/RAS.

If the RBA mode is set-up, the X-state pointer part 31 and the Y-state pointer part 32 start to count from (0,0), respectively.

In more detail, the Y-state pointer part 32 is increased by "1" every the cycle of serial clock. Thereafter, if the 16 cycles of serial clock are lapsed, the Y-state point part 32 is reset and then outputs the Y-state pointer signal YRn for being counted again from (0,0).

The X-state pointer part 31 increases the X-state pointer signal XRn by "1" every when the Y-state point signal YRn of the Y-state pointer part 32 is again reset from to "0". Thereafter, if the X-state pointer signal XRn and the Y-state pointer signal YRn becomes the value of (16, 16), the X-state pointer part 31 and the Y-state pointer part 32 start to again count from (0, 0) to access the data of next block since it is ended to access the data of one block.

That is, the present values of the X-state pointer signal XRn and the Y-state pointer signal YRn represent the displacements to the initial X-address and the initial Y-address, that is, the values of address offset in the memory cell array 40.

The internal clock generator 38 generates system clock signals SYCK to be used as the clock of signals related to the Y-address.

The system clock signal appears from a time point that the Y-address should be enabled utilizing the serial clock SC.

Describing the above the read operation in more detail, the row address generatro 10 generates the internal X-address X-ADD at the falling edge to select a word line and the column address generator 20 generates the internal Y-address Y-ADD after 16 cycles of serial clock are lapsed from a falling edge of the row address strobe signal/RAS, such that data is transmitted from the memory cell array 40 to the seal register 60 and from the serial register 60 to a data line of the input and output 90.

Therefore, in case of the RBA read mode, data are outputted to the input and output pad for block data of the input and output 90 at the falling edge of the row address strobe signal/RAS from after 16 cycles of serial clock. If data are accessed continuously in the RBA mode from this time, data can be accessed and-be outputted continuously up to after 16 cycles of serial clock.

Hereafter, the operation of RBA write will be described with reference to FIG. 7.

The RBA write means a function writing data inputted in serial with the block size of m×n bits, for example, 16×16 bits.

Therefore, the start address becomes a double number of 16 upon performing the write operation.

If the column address strobe signal/CAS and the RBA control signal RBA of "HIGH" state and the write enable signal/WE of "LOW" state are applied to the mode selector 37, the mode selector 37 makes the RBA mode flag signal RBAM to "HIGH" state and makes the write enable latch signal/WEL to "LOW" state.

Therefore, the whole system starts the operation of RBA write mode.

The basic operations of respective blocks are identical to those of the operation of RBA read mode.

The input data applied to the input and output pad of the input and output part 90 appears and starts to be written to the serial register 60 after the row address strobe signal/RAS is fallen and 16 cycles of serial clock are then laped.

It starts to transmit data from the serial register 60 to the memory cell array 40 after 32 cycles of serial clock are lapsed.

So as to control the above operation, the RBA Y enable signal RYE becomes "HIGH" state after 16 cycles of serial clock, thereby causing signals related to the Y-address to be enabled such that data can be written into the serial register 60.

The RBA write X enable signal RWXE becomes "HIGH" state after 32 cycles of serial clock, thereby causing signals related to the X-address to be enabled, such that data is thus transmitted from the serial register 60 to the memory cell array 40.

FIG. 8 and FIG. 9 are to represent the memory maps of the operation of RBA read mode and the operation of RBA write mode, respectively.

Upon performing the read mode, as shown in FIG. 8, a block start access is designated randomly, such that data can be accessed continuously with the block size of m n bits.

Upon performing the write mode, as shown in FIG. 9, the write function of serial block having the block size of m n bits is provided, such that data processed by signal processing unit can be restored in the memory cell array in turn with a same block size.

Since the internal refresh counter 14 is equipped in the memory system, the refresh function can be provided automatically without providing the refresh function from the outside upon performing the read mode or the write mode.

Therefore, the present invention can be properly applied to systems for accessing serial data in the unit of block, upon processing digital signals. As above mentioned, since the present invention can read data with a block size that a signal processer desires designating a random start address without the help of outside controller, it is unnecessary to re-format read data and to use the external control circuit equipped in conventional systems using DRAM, SRAM and frame memory.

Therefore the system load can be reduced, thereby enabling the time for accessing and processing data to be remarkably reduced.

Even upon performing the operation of write, since it is possible to provide the access function of serial block, thereby enabling data processed by the signal processor to be written directly to a memory without reformatting the data using buffers and something like them, External control circuits are not required since and the speed in processing data can thus be reduced.

Since the function of refresh is automatically provided, there is an advantage, in that an optimal function for memory access can be provided in processing video reduction signals of systems, such as H.261, JPEG, MPEG and digital HDTV which are international standards for processing digital signals.

What is claimed is:

1. A memory system for processing digital video signals, comprising:
   a Random Block Access (RBA) control means for controlling a RBA using signals applied to the outside;
   an address generation means for generating an address using an initial address in accordance with the control of the RBA control means;
   a memory cell array for storing data in accordance with the control of the RBA control means and the address generation means;
   a transmission control means for controlling the transmission of data from the memory cell array; and
   an input and output means for inputting and outputting data in accordance with the RBA control means and the transmission control means.

2. A memory system for processing digital video signals, comprising:
   a Random Block Access (RBA) control means for controlling a RBA using signals applied from the outside;
   a row-address generation means for generating a row-address using an initial row address in accordance with the control of the RBA control means:
   a column address generation means for generating a column address using an initial column address in accordance with the control of the RBA control means;
   a memory cell array for selecting a word line in accordance with the control of the row address generation means;
   a RBA selection means for controlling the transmission of data from the memory cell array in accordance with the control of the column address generation means and the RBA control means;
   a serial register means for transmitting data from the memory cell array in accordance with the RBA control means and the RBA selection means;
   a RBA Y-decoding means for controlling the serial register means in accordance with the control of the column address generation means and the RBA control means; and
   an input and output means for inputting and outputting data in accordance with the control of the RBA control means and the serial register means.

3. A memory system for processing digital video signals, comprising:
   a Random Block Access (RBA) control means for controlling a RBA using a row address strobe signal/RAS, a column address strobe signal/CAS, write enable signal/WE, a data transmission signal/DT, serial clock signal SC and a RBA control signal RBA imputted from the outside;
   a row address generation means for generating a row address using initial row address in accordance with the control of the RBA control means;
   a column address generation means for generating a column address using an initial column address in accordance with the control of the RBA control means;
   a memory cell array for selecting a word line in accordance with a row address outputted from the row address generation means;
   a RBA selection means for controlling the transmission of data from the memory cell array in accordance with signals outputted from the column address generation means and the RBA control means;
   a serial register means for transmitting the data of the memory cell array in accordance with signals outputted from the RBA control means and the RBA selection means;
   a RBA Y-decoding means for controlling the serial register means using a column address outputted from the column address generation means in accordance with the control of RBA control means;

an input and output control means for controlling the input and output of data in accordance with the control of RBA control means; and an input and output means for inputting and outputting data between the serial register means and the outside in accordance with the control of input and output control means.

4. A memory system for processing digital video signal, in accordance with claim 1, wherein the address generation means comprises a row address generation means and a column address generation means.

5. A memory system for processing digital video signals, in accordance with claim 1, wherein the transmission control means comprises:

a RBA selection means for controlling the transmission of data from the memory cell array in accordance with the control of the address generation means and the RBA control means;

a serial register means for transmitting the data of the memory cell array in accordance with signals outputted from the RBA control means and the RBA selection means and a RBA Y-decoding means for controlling the serial register means in accordance with the control of the address generation means and the RBA control means.

6. A memory system for processing digital video signals in accordance with claim 1, wherein the input and output means comprises;

an input and output control part for controlling the input of output and output in accordance with the control of RBA control means and an input and output part for inputting and outputting data between the transmission control means and the outside in accordance with the control of the input and output control means.

7. A memory system for processing digital video signals in accordance with claim 2, wherein the input and output means comprises;

an input and output control part for controlling the input and output in accordance with the control of RBA control means and an input and output part for inputting and outputting data between the transmission control means and the outside in accordance with the control of the input and output control means.

8. A memory system for processing digital video signals in accordance with claim 2, wherein the row address generation means comprises:

a X-address buffer means for latching an initial row address of address input signals AI;

a RBA X-address counter control means for designating the counting time of row address using a write enable latch signal/WEL, a RBA write X-enable signal RWXE, a RBA mode flag signal RBAM, a X-state pointer signal XRn, a Y-state pointer signal YRn and an internal RAS signal/RASi ouputted from the RBA control means;

a RBA X-address count means for increasing the row address using the serial clock SC in accordance with the control of RBA X-address count control means; and a X-address decoding means for decoding the counted row address outputted from the RBA X-address count means.

9. A memory system for processing digital video signals in accordance with claim 3, wherein the row address generation means comprises:

a X-address buffer means for latching an initial row address of address input signals AI;

a RBA X-address counter control means for designating the counting time of row address using a write enable latch signal/WEL, a RBA write X-enable signal RWXE, a RBA mode flag signal RBAM, a X-state pointer signal XRn, a Y-state pointer signal YRn and an internal RAS signal/RASi ouputted from the RBA control means;

a RBA X-address count means for increasing the row address using the serial clock SC in accordance with the control of RBA X-address count control means; and a X-address decoding means for decoding the counted row address outputted from the RBA X-address count means.

10. A memory system for processing digital video signals in accordance with claim 4, wherein the row address generation means comprises:

a X-address buffer means for latching an initial row address of address input signals AI;

a RBA X-address counter control means for designating the counting time of row address using a write enable latch signal WEL, a RBa write X-enalbe signal RWXE, a RBA mode flag signal RBAM, a X-state pointer signal XRn, a Y-state pointer signal YRn and an internal RAS signal/RASi ouputted from the RBA control means;

a RBA X-address count means for increasing the row address using the serial clock SC in accordance with the control of RBA X-address count control means; and a X-address decoding means for decoding the counted row address outputted from the RBA X-address count means.

11. A memory system for processing digital video signals in accordance with claim 2, wherein the column address generation means comprises:

a RBA Y-address buffer means for delaying an initial column address of address input signals AI for the cycle of serial clock having the unit of data block;

a RBA Y-address buffer control means for controlling the RBA Y-address buffer means using a RBA mode flag signal RBAM, a RBA Y-enable signal RYE, an internal CASsignal/CASi, a X-state point signal XRn and a Y-state pointer signal YRn outputted from the RBA control means;

a Y-address count means for increasing the column address using the system clock SYCK outputted from the RBA control means in accordance with the control of the RBA Y-address buffer control means; and a Y-address pre-decoding means for pre-decoding the counted column address outputted from the Y-address count means.

12. A memory system for processing digital video signals in accordance with claim 3, wherein the column address generation means comprises:

a RBA Y-address buffer means for delaying an initial column address of address input signals AI for the cycle of serial clock having the unit of data block;

a RBA Y-address buffer control means for controlling the RBA Y-address buffer means using a RBA mode flag signal RBAM, a RBA Y-enable signal RYE, an internal CAS signal/CASi, a X-state point signal XRn and a Y-state pointer signal YRn outputted from the RBA control means;

a Y-address count means for increasing the column address using the system clock SYCK outputted from the RBA control means in accordance with the control of the RBA Y-address buffer control means; and a Y-address pre-decoding means for pre-decoding the counted column address outputted from the Y-address count means.

13. A memory system for processing digital video signals in accordance with claim 4, wherein the column address generation means comprises:

a Random Block Access (RBA) Y-address-buffer means for delaying an initial column address of address input signals AI for a cycle of serial clock having the unit of data block;

a RBA Y-address buffer control means for controlling the RBA Y-address buffer means using a RBA mode flag signal RBAM, a RBA Y-enable signal RYE, an internal CAS signal/CASi, a X-state point signal XRn and a Y-state pointer signal YRn outputted from the RBA control means;

a Y-address count means for increasing the column address using the system clock SYCK outputted from the RBA clock means in accordance with the control of the RBA Y-address buffer control means; and a Y-address pre-decoding means for pre-decoding the counted column address outputted from the Y-address count means.

14. A memory system for processing digital video signals in accordance with claim 3, wherein the RBA control means comprises:

a Y-state pointer means for outputting a Y-state pointer signal YRn counted in accordance with every cycle of serial clock if the RBA mode is set-up using the serial clock SC applied from the outside;

a X-state pointer means for outputting a X-state pointer signal XRn counted in accordance with the Y-state pointer signal YRn outputted from the Y-state pointer means using the serial clock SC applied from the outside;

an internal RAS generation means for outputting an internal RAS signal/RASi to be used in the inside of system using the X-state pointer signal XRn, the Y-state pointer signal and the row address strobe signal/RAS inputted from the outside;

an internal CAS generation means for outputting an internal CAS signal/CASi to be used in the inside of system using the X-state pointer signal XRn, the Y-state pointer signal YRn and the column address strobe signal/CAS inputted from the outside;

a transmission control means for outputting a transmission signal XF, a register enable signal RGE and a serial decoder enable signal SDE which control the transmission of data between the memory cell array means and the serial register means and also the transmission of data between the serial register means and the input and output means, to the RBA selection means, the serial register means and the RBA Y-decoding means, respectively, using the Y-state pointer signal YRn and the serial clock SC inputted from the outside;

a read and write control means for outputting a write X-enable signal RWXE to the input and output control means and the row-address generation means, outputting a RBA state pointer enable signal RSPE to the input and output control means, the X-state pointer means and the Y-state pointer means and also outputting a RBA Y-enable signal RYE to the column address generation means and the input and output control means, to control the start time of operation upon performing the read mode and the write mode using the X-state pointer signal XRn and the Y-state pointer signal YRn outputted from the X-state pointer means and the Y-state pointer means;

a mode selection means for outputting a RBA mode flag signal RBAM for setting-up the RBA mode to the input and output control means, the row address generation means, the column address generation means, the X-state pointer means, the Y-state pointer means, the internal RAS generation means, the internal CAS generation means, the transmission control means and the read and write control means and also outputting a write enable latch signal/WEL representing the write mode and the read mode to the input and output control means, the error address generation means and the read and write control means using the data transfer signal/DT, the RBA control signal RBA and the write enable/WE inputted from the outside, and the X-state pointer signal XRn and the Y-state pointer signal YRn outputted from the X-state pointer means and the Y-state pointer means respectively; and an internal clock generation means for generating a system clock SYCK to be used as the clock of signals related to the Y-address, using the RBA mode flag signal RBAM outputted from the mode selection means, the RBA Y-enable signal RYE outputted from the read and write control means and the serial clock inputted from the outside.

15. A memory system for processing digital video signals in accordance with claim 5, wherein the RBA control means comprises:

a Y-state pointer means for outputting a Y-state pointer signal YRn counted in accordance with every cycle of serial clock if the RBA mode is set-up using the serial clock SC applied from the outside;

a X-state pointer means for outputting a X-state pointer signal XRn counted in accordance with the Y-state pointer signal YRn outputted from the Y-state pointer means using the serial clock SC applied from the outside;

an internal RAS generation means for outputting an internal RAS signal/RASi to be used in the inside of system using the X-state pointer signal XRn, the Y-state pointer signal and the row address strobe signal/RAS inputted from the outside;

an internal CAS generation means for outputting an internal CAS signal/CASi to be used in the inside of system using the X-state pointer signal XRn, the Y-state pointer signal YRn and the column address strobe signal/CAS inputted from the outside;

a transmission control means for outputting a transmission signal XF, a register enable signal RGE and a serial decoder enable signal SDE which control the transmission of data between the memory cell array means and the serial register means and also the transmission of data between the serial register means and the input and output means, to the RBA selection means, the serial register means and the RBA Y-decoding means, respectively, using the Y-state pointer signal YRn and the serial clock SC inputted from the outside;

a read and write control means for outputting a write X-enable signal RWXE to the input and output control means and the row-address generation means, outputting a RBA state pointer enable signal RSPE to the input and output control means, the X-state pointer means and the Y-state pointer means and also outputting a RBA Y-enable signal RYE to the column address generation means and the input and output control means, to control the start time of operation upon performing the read mode and the write mode using the X-state pointer signal XRn and the Y-state pointer signal YRn outputted from the X-state pointer means and the Y-state pointer means;

a mode selection means for outputting a RBA mode flag signal RBAM for setting-up the RBA mode to the input and output control means, the row address generation means, the column address generation means, the X-state pointer means, the Y-state pointer means, the internal RAS generation means, the internal CAS generation means, the transmission control means and the read and write control means and also outputting a write enable latch signal/WEL representing the write mode and the read mode to the input and output control means, the error address generation means and the read and write control means using the data transfer signal/DT, the RBA control signal RBA and the write enable/WE inputted from the outside, and the X-state pointer signal XRn and the Y-state pointer signal YRn outputted from the X-state pointer means and the Y-state state pointer means respectively; and an internal clock generation means for generating a system clock SYCK to be used as the clock of signals related to the Y-address, using the RBA mode flag signal RBAM outputted from the mode selection means, the RBA Y-enable signal RYE outputted from the read and write control means and the serial clock inputted from the outside.

16. A memory system for processing digital video signals in accordance with claim 6, wherein the RBA control means comprises:

a Y-state pointer means for outputting a Y-state pointer signal YRn counted in accordance with every cycle of serial clock if the RBA mode is set-up using the serial clock SC applied from the outside;

a X-state pointer means for outputting a X-state pointer signal XRn counted in accordance with the Y-state pointer signal YRn outputted from the Y-state pointer means using the serial clock SC applied from the outside;

an internal RAS generation means for outputting an internal RAS signal/RASi to be used in the inside of system using the X-state pointer signal XRn, the Y-state pointer signal and the row address strobe signal/RAS inputted from the outside;

an internal CAS generation means for outputting an internal CAS signal/CASi to be used in the inside of system using the X-state pointer signal XRn, the Y-state pointer signal YRn and the column address strobe signal/CAS inputted from the outside;

a transmission control means for outputting a transmission signal XF, a register enable signal RGE and a serial decoder enable signal SDE which control the transmission of data between the memory cell array means and the serial register means and also the transmission of data between the serial register means and the input and output means, to the RBA selection means, the serial register means and the RBA Y-decoding means, respectively, using the Y-state pointer signal YRn and the serial clock SC inputted from the outside;

a read and write control means for outputting a write X-enable signal RWXE to the input and output control means and the row-address generation means, outputting a RBA state pointer enable signal RSPE to the input and output control means, the X-state pointer means and the Y-state pointer means and also outputting a RBA Y-enable signal RYE to the column address generation means and the input and output control means, to control the start time of operation upon performing the read mode and the write mode using the X-state pointer signal XRn and the Y-state pointer signal YRn outputted from the X-state pointer means and the Y-state pointer means;

a mode selection means for outputting a RBA mode flag signal RBAM for setting-up the RBA mode to the input and output control means, the row address generation means, the column address generation means, the X-state pointer means, the Y-state pointer means, the internal RAS generation means, the internal CAS generation means, the transmission control means and the read and write control means and also outputting a write enable latch signal/WEL representing the write mode and the read mode to the input and output control means, the error address generation means and the read and write control means using the data transfer signal/DT, the RBA control signal RBA and the write enable/WE inputted from the outside, and the X-state pointer signal XRn and the Y-state pointer signal YRn outputted from the X-state pointer means and the Y-state pointer means respectively; and an internal clock generation means for generating a system clock SYCK to be used as the clock of signals related to the Y-address, using the RBA mode flag signal RBAM outputted from the mode selection means, the RBA Y-enable signal RYE outputted from the read and write control means and the serial clock inputted from the outside.

17. A memory system for processing digital video signals in accordance with claim 7, wherein the RBA control means comprises:

a Y-state pointer means for outputting a Y-state pointer signal YRn counted in accordance with every cycle of serial clock if the RBA mode is set-up using the serial clock SC applied from the outside;

a X-state pointer means for outputting a X-state pointer signal XRn counted in accordance with the Y-state pointer signal YRn outputted from the Y-state pointer means using the serial clock SC applied from the outside;

an internal RAS generation means for outputting an internal RAS signal/RASi to be used in the inside of system using the X-state pointer signal XRn, the Y-state pointer signal and the row address strobe signal/RAS inputted from the outside;

an internal CAS generation means for outputting an internal CAS signal/CASi to be used in the inside of system using the X-state pointer signal XRn, the Y-state pointer signal YRn and the column address strobe signal/CAS inputted from the outside;

a transmission control means for outputting a transmission signal XF, a register enable signal RGE and a serial decoder enable signal SDE which control the transmission of data between the memory cell array means and the serial register means and also the transmission of data between the serial register means and the input and output means, to the RBA selection means, the serial register means and the RBA Y-decoding means, respectively, using the Y-state pointer signal YRn and the serial clock SC inputted from the outside;

a read and write control means for outputting a write X-enable signal RWXE to the input and output control means and the row-address generation means, outputting a RBA state pointer enable signal RSPE to the input and output control means, the X-state pointer means and the Y-state pointer means and also outputting a RBA Y-enable signal RYE to the column address generation means and the input and output control means, to control the start time of operation upon performing the read mode and the write mode using the X-state pointer signal XRn and the Y-state pointer signal YRn outputted from the X-state pointer means and the Y-state pointer means;

a mode selection means for outputting a RBA mode flag signal RBAM for setting-up the RBA mode to the input and output control means, the row address generation means, the column address generation means, the X-state pointer means, the Y-state pointer means, the internal RAS generation means, the internal CAS generation means, the transmission control means and the read and write control means and also outputting a write enable latch signal/WEL representing the write mode and the read mode to the input and output control means, the error address generation means and the read and write control means using the data transfer signal/DT, the RBA control signal RBA and the write enable/WE inputted from the outside, and the X-state pointer signal XRn and the Y-state pointer signal YRn outputted from the X-state pointer means and the Y-state pointer means respectively; and an internal clock generation means for generating a system clock SYCK to be used as the clock of signals related to the Y-address, using the RBA mode flag signal RBAM outputted from the mode selection means, the RBA Y-enable signal RYE outputted from the read and write control means and the serial clock inputted from the outside.

18. A memory system for processing digital video signals in accordance with claim 8, wherein the RBA X-address count means increase the row address by 1 every cycle of serial clock having the unit of data block.

19. A method for processing digital video signals in accordance with 8, further comprising an internal refresh counter for counting the row address increased by 1 every the initial value to generate a row-address capable of refreshing cells of the memory cell array and then outputting the row address to the X address decoding means.

20. A memory system for processing digital video signals in accordance with claim 11, further comprising a Y-address buffer means for latching an initial column address of address input signals AI and then outputting it to the RBA Y-address buffer means.

21. A memory system for processing digital video signals in accordance with claim 12, further comprising a Y-address buffer means for latching an initial column address of address input signals AI and then outputting it to the RBA Y-address buffer means.

22. A memory system for processing digital video signals in accordance with claim 13, further comprising a Y-address buffer means for latching an initial column address of address input signals AI and then outputting it to the RBA Y-address buffer means.

23. A memory system for processing digital video signals in accordance with claim 11, wherein the Y-address count means increases the column address by "1" every cycle of serial clock having the unit of data block using the system clock SACK outputted from the RBA control means in accordance with the control of the RBA Y-address buffer control means.

24. A memory system for processing digital video signals in accordance with claim 12, wherein the Y-address count means increases the column address by "1" every cycle of serial clock having the unit of data block using the system clock SACK outputted from the RBA control means in accordance with the control of the RBA Y-address buffer control means.

25. A memory system for processing digital video signals in accordance with claim 13, wherein the Y-address count means increases the column address by "1" every cycle of serial clock having the unit of data block using the system clock SACK outputted from the RBA control means in accordance with the control of the RBA Y-address buffer control means.

26. A memory system for processing digital video signals in accordance with claim 14, Wherein the Y-state pointer means increases to count by "1" every cycle of serial clock using the serial clock SC applied to the outside if the RBA mode is set up and then outputs the Y-state pointer signal YRn for again starting to count by being reset if the cycle of serial clock having the unit of data block is lapsed.

27. A memory system for processing digital video signals in accordance with claim 15, wherein the Y-state pointer means increases to count by "1" every cycle of serial clock using the serial clock SC applied to the outside if the RBA mode is set up and then outputs the Y-state pointer signal YRn for again starting to count by being reset if the cycle of serial clock having the unit of data block is lapsed.

28. A memory system for processing digital video signals in accordance with claim 16, wherein the Y-state pointer means increases to count by "1" every cycle of serial clock using the serial clock SC applied to the outside if the RBA mode is set up and then outputs the Y-state pointer signal YRn for starting to count again by being reset if the cycle of serial clock having the unit of data block is lapsed.

29. A memory system for processing digital video signals in accordance with claim 17, wherein the Y-state pointer means increases to count by "1" every cycle of serial clock using the serial clock SC applied to the outside if the RBA mode is set up and then outputs the Y-state pointer signal YRn for starting to count again by being reset if the cycle of serial clock having the unit of data block is lapsed.

30. A memory system for processing digital video signals in accordance with claim 14, wherein the X-state pointer means increases to count by "1" every when the Y-state pointer signal YRn outputted from the Y-state pointer means is reset from the unit of data block to "0", using the serial clock-SC applied from the outside.

31. A memory system for processing digital video signals in accordance with claim 15, wherein the X-state pointer means increases to count by "1" every when the Y-state pointer signal YRn outputted from the Y-state pointer means is reset from the unit of data block to "0", using the serial clock SC applied from the outside.

32. A memory system for processing digital video signals in accordance with claim 16, wherein the X-state pointer means increases to count by "1" every when the Y-state pointer signal YRn outputted from the Y-state pointer means is reset from the unit of data block to "0", using the serial clock SC applied from the outside.

33. A memory system for processing digital video signals in accordance with claim 17, wherein the X-state pointer means increases to count by "1" every when the Y-state pointer signal YRn outputted from the Y-state pointer means is reset from the unit of data block to "0", using the serial clock SC applied from the outside.

34. A memory system for processing digital video signals in accordance with claim 14, wherein the internal RAS generation means outputs an internal RAS signal/RASi for accessing the data of memory cell array during the first half of the cycle of serial clock having the unit of data block and also outputs an internal RAS signal/RASi for refreshing during the second half of the cycle of serial clock having the unit of data block, using the X-state pointer signal XRn outputted from the X-state pointer means, the Y-state pointer signal YRn outputted from the Y-state pointer means and the row-address strobe signal/RAS.

35. A memory system for processing digital video signals in accordance with claim 15, wherein the internal RAS generation means outputs an internal RAS signal/RASi for accessing the data of memory cell array during the first half of the cycle of serial clock having the unit of data block and also outputs an internal RAS signal/RASi for refreshing during the second half of the cycle of serial clock having the unit of data block, using the X-state pointer signal XRn outputted from the X-state pointer means, the Y-state pointer signal YRn outputted from the Y-state pointer means and the row-address strobe signal/RAS.

36. A memory system for processing digital video signals in accordance with claim 16, wherein the internal RAS generation means outputs an internal RAS signal/RASi for accessing the data of memory cell array during the first half of the cycle of serial clock having the unit of data block and also outputs an internal RAS signal/RASi for refreshing during the second half of the cycle of serial clock having the unit of data block, using the X-state pointer signal XRn outputted from the X-state pointer means, the Y-state pointer signal YRn outputted from the Y-state pointer means and the row-address strobe signal/RAS.

37. A memory system for processing digital video signals in accordance with claim 17, wherein the internal RAS generation means outputs an internal RAS signal/RASi for accessing the data of memory cell array during the first half of the cycle of serial clock having the unit of data block, using the X-state pointer signal XRn outputted from the X-state pointer means, the Y-state pointer signal YRn outputted from the Y-state pointer means and the row-address strobe signal/RAS.

38. A memory system for processing digital video signals in accordance with claim 14, the internal CAS generation means outputs an internal CAS signal/CASi for accessing the data of memory cell array during the first half of the cycle of serial clock having the unit of data block, and also outputs an internal CAS signal/CASi for refreshing during the second half of the cycle of serial clock, using the X-state pointer signal, the Y-state pointer signal and the column address strobe signal/CAS.

39. A memory system for processing digital video signals in accordance with claim 15, the internal CAS generation means outputs an internal CAS signal/CASi for accessing the data of memory cell array during the first half of the cycle of serial clock having the unit of data block, and also outputs an internal CAS signal/CASi for refreshing during the second half of the cycle of serial clock, using the X-state pointer signal, the Y-state pointer signal and the column address strobe signal/CAS.

40. A memory system for processing digital video signals in accordance with claim 16, the internal CAS generation means outputs an internal CAS signal/CASi for accessing the data of memory cell array during the first half of the cycle of serial clock having the unit of data block, and also outputs an internal CAS signal/CASi for refreshing during the second half of the cycle of serial clock, using the X-state pointer signal, the Y-state pointer signal and the column address strobe signal/CAS.

41. A memory system for processing digital video signals in accordance with claim 17, the internal CAS generation means outputs an internal CAS signal/CASi for accessing the data of memory cell array during the first half of the cycle of serial clock having the unit of data block, and also outputs an internal CAS signal/CASi for refreshing during the second half of the cycle of serial clock, using the X-state pointer signal, the Y-state pointer signal and the column address strobe signal/CAS.

42. A memory system for processing digital video signals in accordance with claim 14, wherein the RBA Y-enable signal RYE is generated after the cycle of serial clock having the unit of data block so that the word line of memory cell array is selected enough by the row address and the column address can be then generated.

43. A memory system for processing digital video signals in accordance with claim 15, wherein the RBA Y-enable signal RYE is generated after the cycle of serial clock having the unit of data block so that the word line of memory cell array is selected enough by the row address and the column address can be then generated.

44. A memory system for processing digital video signals in accordance with claim 16, wherein the RBA Y-enable signal RYE is generated after the cycle of serial clock having the unit of data block so that the word line of memory cell array is selected enough by the row address and the column address can be then generated.

45. A memory system for processing digital video signals in accordance with claim 17, wherein the RBA Y-enable signal RYE is generated after the cycle of serial clock having the unit of data block so that the word line of memory cell array is selected enough by the row address and the column address can be then generated.

46. A memory system for processing digital video signals in accordance with claim 14, wherein the system clock SYCK appears from a time in which the Y-address must be enabled and also has a cycle same as that of the serial clock.

47. A memory system for processing digital video signals in accordance with claim 15, wherein the system clock SYCK appears from a time in which the Y-address must be enabled and also has a cycle same as that of the serial clock.

48. A memory system for processing digital video signals in accordance with claim 16, in the system clock SYCK appears from a time in which the address must be enabled and also has a cycle same as that of the serial clock.

49. A memory system for processing digital video signals in accordance with claim 17, wherein the system clock SYCK appears from a time in which the Y-address must be enabled and also has a cycle same as that of the serial clock.

50. A memory system for processing digital video signals in accordance with claim 19, further comprising a X-address decoding means for outputting the row address outputted from the RBA X-address counter means and the refresh address outputted from the internal refresh count means to the Y-address decoding means by alternately decoding them during the cycle of serial clock having the unit of data block.

51. A memory system for processing digital video signals in accordance with claim 50, the X-address pre-decoding means selects a word line for accessing the data of memory cell array during the first half of serial clock having the unit of data block and also pre-decodes the row address during the second half of the cycle of serial clock so that the refresh can be performed using the refresh address.

* * * * *